United States Patent [19]

Pross, Jr.

[11] 4,106,105
[45] Aug. 8, 1978

[54] ZERO DETECTOR

[75] Inventor: John William Pross, Jr., Newfoundland, N.J.

[73] Assignee: The Singer Company, Little Falls, N.J.

[21] Appl. No.: 772,708

[22] Filed: Feb. 28, 1977

[51] Int. Cl.² ............................................. G11C 7/00
[52] U.S. Cl. .......................... 364/900; 340/347 DD
[58] Field of Search ... 364/900 MS File, 200 MS File; 340/347 DR

[56] References Cited

U.S. PATENT DOCUMENTS

| | | | |
|---|---|---|---|
| 2,934,746 | 4/1960 | Woo | 340/174 |
| 3,568,162 | 3/1971 | Toy | 340/172.5 |
| 3,805,254 | 4/1974 | Schuur | 340/172.5 |

*Primary Examiner*—Gareth D. Shaw
*Assistant Examiner*—C. T. Bartz

*Attorney, Agent, or Firm*—Laurence A. Wright; Thomas W. Kennedy

[57] ABSTRACT

An integrated circuit comprising first and second read-only memories (ROM), an adder circuit and a NOR gate for determining if the content of an input data word has more zeros than ones. The invention is usable in core memories for the purpose of reducing the power requirements of the core memory. Each of the read-only memories provides a set of output data bits which are less in number than the input data word. These output bits are then applied to the adder circuit where it is determined whether the number of zeros is equal to or greater than the number of ones. The output signals from the adder circuit are applied to the NOR gate which provides a signal to the core memory instructing it to convert all zeros to ones, and all ones to zeros, thereby effecting a reduction in the power requirements of the core memory.

10 Claims, 3 Drawing Figures

FIG. 2

| $M_0$–$M_3$ OR $M_8$–$M_{11}$ \ $M_4$–$M_7$ OR $M_{12}$–$M_{15}$ | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 8 | 7 | 7 | 6 | 7 | 6 | 6 | 5 | 7 | 6 | 6 | 5 | 6 | 5 | 5 | 4 |
| 1 | 7 | 6 | 6 | 5 | 6 | 5 | 5 | 4 | 6 | 5 | 5 | 4 | 5 | 4 | 4 | 3 |
| 2 | 7 | 6 | 6 | 5 | 6 | 5 | 5 | 4 | 6 | 5 | 5 | 4 | 5 | 4 | 4 | 3 |
| 3 | 6 | 5 | 5 | 4 | 5 | 4 | 4 | 3 | 5 | 4 | 4 | 3 | 4 | 3 | 3 | 2 |
| 4 | 7 | 6 | 6 | 5 | 6 | 5 | 5 | 4 | 6 | 5 | 5 | 4 | 5 | 4 | 4 | 3 |
| 5 | 6 | 5 | 5 | 4 | 5 | 4 | 4 | 3 | 5 | 4 | 4 | 3 | 4 | 3 | 3 | 2 |
| 6 | 6 | 5 | 5 | 4 | 5 | 4 | 4 | 3 | 5 | 4 | 4 | 3 | 4 | 3 | 3 | 2 |
| 7 | 5 | 4 | 4 | 3 | 4 | 3 | 3 | 2 | 4 | 3 | 3 | 2 | 3 | 2 | 2 | 1 |
| 8 | 7 | 6 | 6 | 5 | 6 | 5 | 5 | 4 | 6 | 5 | 5 | 4 | 5 | 4 | 4 | 3 |
| 9 | 6 | 5 | 5 | 4 | 5 | 4 | 4 | 3 | 5 | 4 | 4 | 3 | 4 | 3 | 3 | 2 |
| A | 6 | 5 | 5 | 4 | 5 | 4 | 4 | 3 | 5 | 4 | 4 | 3 | 4 | 3 | 3 | 2 |
| B | 5 | 4 | 4 | 3 | 4 | 3 | 3 | 2 | 4 | 3 | 3 | 2 | 3 | 2 | 2 | 1 |
| C | 6 | 5 | 5 | 4 | 5 | 4 | 4 | 3 | 5 | 4 | 4 | 3 | 4 | 3 | 3 | 2 |
| D | 5 | 4 | 4 | 3 | 4 | 3 | 3 | 2 | 4 | 3 | 3 | 2 | 3 | 2 | 2 | 1 |
| E | 5 | 4 | 4 | 3 | 4 | 3 | 3 | 2 | 4 | 3 | 3 | 2 | 3 | 2 | 2 | 1 |
| F | 4 | 3 | 3 | 2 | 3 | 2 | 2 | 1 | 3 | 2 | 2 | 1 | 2 | 1 | 1 | 0 |

ZERO DETECTOR

This invention is related to memory core control devices. More particularly, this invention is related to a zero detector for a memory control for determining the number of zeros in an input data word.

BACKGROUND OF THE INVENTION

The power requirements of a core memory are directly related to the number of zeros to be written into or read out of the core memory. That is, there is an increased power consumption in the memory core where the content of a data word contains more zeros than ones. A substantial power saving can be effected by means capable of determining when it would be advantageous to reverse the polarity of the input data word when writing into the memory. Of course, each word in the memory must contain an additional bit to indicate if the polarity of that word has been reversed so that it can be restored to its original polarity when read out.

In the past, devices using this method of conserving power have employed analog rather than digital techniques. The analog method involves converting the data input from digital form to a voltage level whose magnitude is compared to a reference voltage. The disadvantages of the analog method are that it requires numerous expensive parts and it is not readily expanded as the size of the data word increases.

BRIEF DESCRIPTION OF THE INVENTION

The present zero detector of the invention is a device usable with core memories for determining if the content of a data word has more zeros than ones. The invention comprises three integrated circuits and an output NOR gate. For purposes of the descriptions of the invention, a 16 bit data word is implemented. The 16 bit data word is divided into two parts of 8 bits each. The first eight bits are used to address a first read-only memory (ROM) and the second eight bits address a second read-only memory. Out of each read-only memory, there will be a number equal to the number of zeros on the lines addressing the memories. These numbers are applied to a four bit adder circuit which computes their sum. The sum appears on the outputs of the adder which shows whether the number of zeros in the word is greater than or equal to eight. These signals are then applied to a NOR gate and inverted to provide the desired output signal.

Accordingly, it is an object of this invention to provide a zero detector for use in core memories for determining the number of zeros in a data word and converting the zeros to ones, and ones to zeros, in order to conserve the power requirements of the memory circuits.

These and other objects, features and advantages of the present invention will become apparent from the following description taken in conjunction with the accompanying drawings wherein:

FIG. 2 shows in tabular format the content of each word in both read-only memories.

Figure 1:
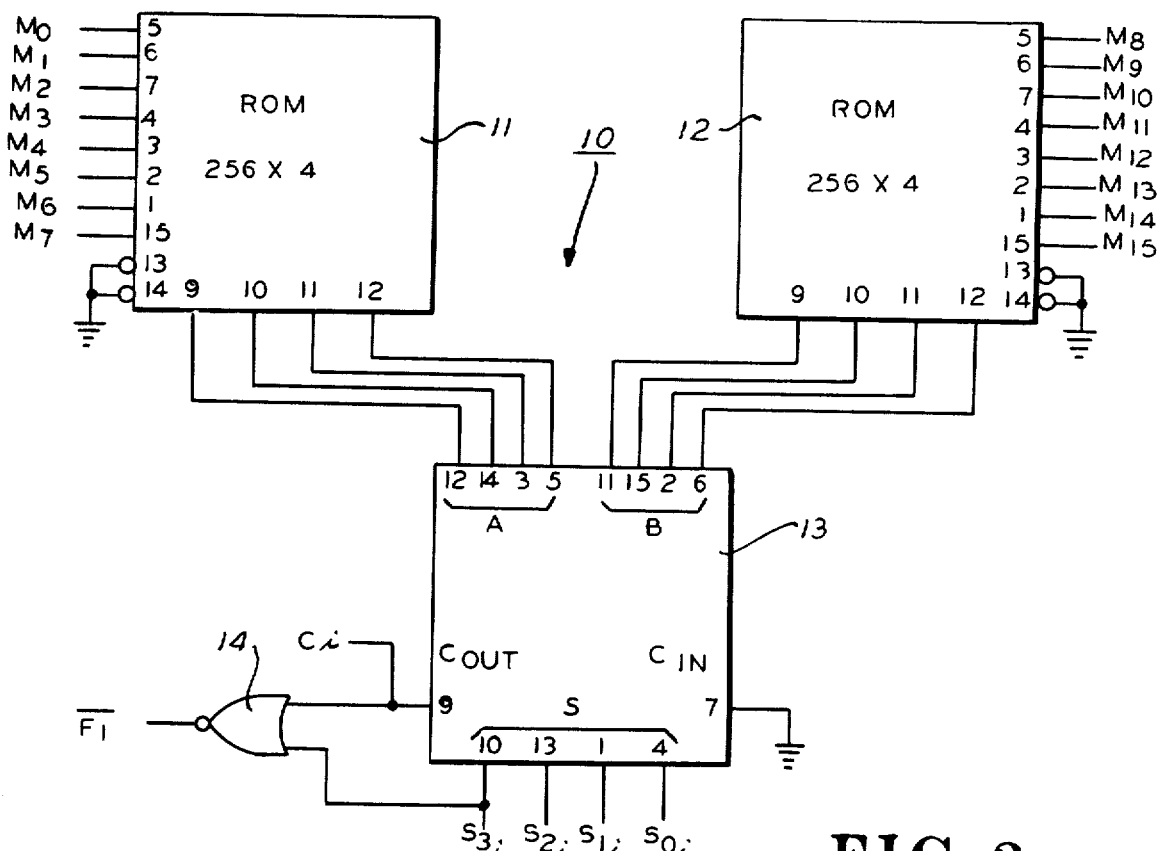
FIG. 1 is a schematic diagram of the zero detector of the invention.

Referring now to FIG. 1, there is shown the zero detector 10 of the invention as it applies to a 16 bit data word. It consists of a first ROM 11, a second ROM 12, an adder 13 and a NOR gate 14. All of these components may comprise integrated circuits well-known to those skilled in the art. The input data word to ROM 11 and 12 is carried by signal lines M0, M1 . . . M15. The output signal whose polarity determines if the polarity of the input data word should be reversed or not, is designated $\overline{F}_1$ from NOR gate 14. Five other signal outputs from adder 13 are designated $S_{0i}$, $S_{1i}$, $S_{2i}$, $S_{3i}$ and $C_i$. These outputs are used for the purpose of expanding the detector for larger size input data words. The 16 bit data word is divided into two sets of 8 bits each. Each set is used to address a ROM of size 256 words by 4 bits. FIG. 1 shows bits M0, M1 . . . M7 connected to the address inputs of ROM 11. Bits M8, M9 . . . M15 are similarly connected to ROM 12. The most significant address line is designated 5 on both ROM 11 and ROM 12. The least significant bit is designated 15, and the intervening address lines are designated in the figure in a regular way.

The content of each word of both read-only memories is shown in FIG. 2. All the numbers in this figure are represented using the hexadecimal number system. The top row of numbers represents the content of input data bits M0, M1, M2 and M3, in the case of ROM 11 and input data bits M8, M9, M10 and M11 in the case of ROM 12. Similarly, the first column on the left of FIG. 2 represents the content of input data bits M4, M5, M6, M7 or M12, M13, M14 or M15. All the rest of the numbers represent the content of each particular location in the ROM. For example, if M0 = 0, M1 = 1, M2 = 0, M3 = 1, M4 = 0, M5 = 1, M6 = 1 and M7 = 1, then we would go to column 5 and row 7 and find at the intersection a 3. The content of each word of the ROM is always a number which represents the number of zeros in the address word. As in the example above, there were three zeros in the address, M0, M2 and M4; hence, we find a 3 at that address.

So out of each ROM there will be a number equal to the number of zeros in the input data lines addressing the individual ROM. These numbers come out on lines designated 9, 10, 11 and 12 of each ROM. In each case, signal line 9 is the most significant and signal line 12 is the least significant. These two numbers are then directed to the four bit adder circuit 13. The adder circuit computes the sum of these two numbers. This sum appears on the outputs of the adder circuit designated as 4, 1, 13, 10 and 9. The signal at output 9, also called $C_i$, has a weight of $2^4$ and is the most significant. The signal at output 10, also called $S_{3i}$, has a weight of $2^3$. The remaining signals have correspondingly lesser weights. If either $S_{3i}$ or $C_i$ contain a "1", then the number of zeros in the input data word is greater than or equal to eight. These two signal lines are then "OR'ED" together in NOR gate 14 and then inverted to form the output signal $\overline{F}_1$. $\overline{F}_1$ is equal to zero if the number of zeros is greater than or equal to the number of ones, $\overline{F}_1$ is equal to one if the number of zeros is less than the number of ones.

Figure 3:
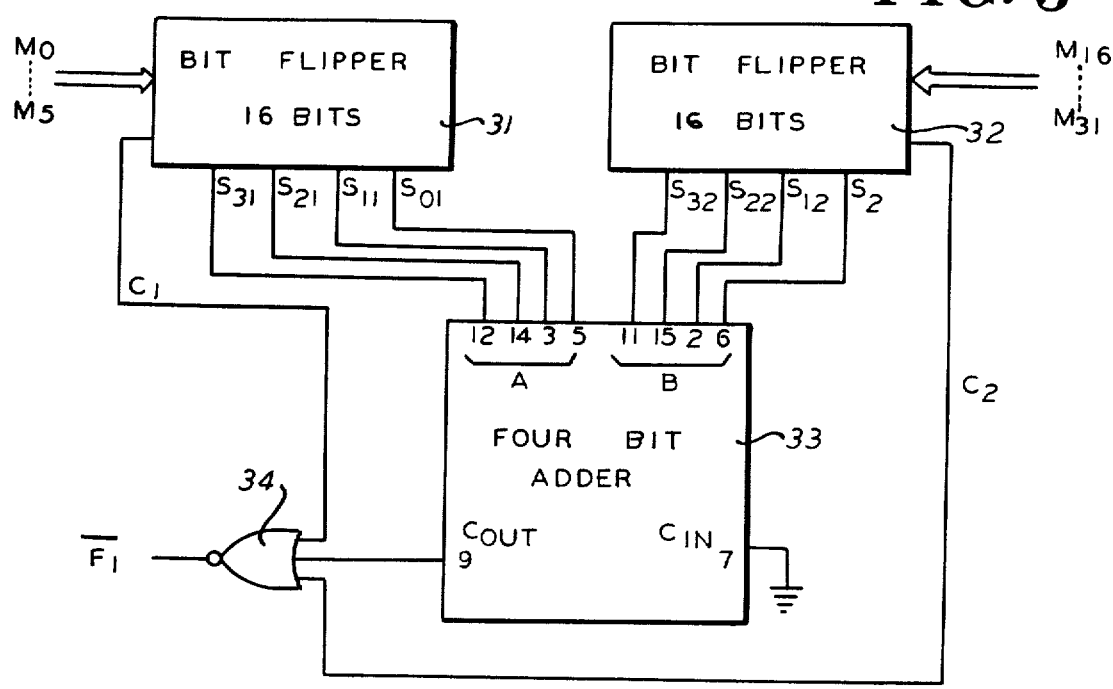
FIG. 3 illustrates how the invention may be expanded for a larger data bit word.

Turning to FIG. 3, there is shown a technique for zero detection for a memory which as a 32 bit data word. In this instance, two 16 bit zero detectors 31 and 32 direct their outputs to another four bit adder 33 whose output, 9, will have a weight of 16. This signal is "OR'ED" in NOR gate 34 with the outputs C1 and C2 (each of which has a weight of 16), from the two 16 bit zero detectors to obtain output signal $\overline{F}_1$. Here $\overline{F}_1$ is equal to zero if the number of zeros is equal to or greater than the number of ones. $\overline{F}_1$ is equal to one if the number of zeros is less than the number of ones.

The present invention also has the additional function in that it is capable of computing the parity of the input data word. Referring again to FIG. 1, the signal called $S_{0i}$ is the parity of the input data word. If the number of ONES in the word is odd, this signal will be at a high voltage (e.g. 2.4 to 5.0 volts), and if the number of ONES in the input data word is even, this signal will be at a low voltage (0.0 to 0.4 volts). Parity is a useful attribute of a word since it can be stored into memory along with the word itself and then be used as a validity check of the word whenever it is read out of the memory.

From the foregoing, a zero detector for determining the number of zeros in an input data word of a variable number of bits has been described. Although only preferred embodiments of the present invention have been described herein, it is not intended that the invention be restricted thereto, but that it be limited only by the true spirit and scope of the appended claims.

What is claimed is:

1. A zero detector comprising:
    means for encoding an input data word containing a number of zero and one bits into two sets of output data bits containing zero and one bits each of said sets of output data bits being a lesser number of bits than the number of bits in said input data word, said sets of output data bits representing the number of zero bits in said input data word,
    means for summing said bits in each set of output data bits, and
    means responsive to said summing means for determining whether the total number of zeros in said input data words equals or exceeds the number of one bits.

2. The zero detector of claim 1 wherein said encoding means comprises:
    a first read-only memory for converting a first group of bits of said input data word into a first set of output data bits, and
    a second read-only memory for converting a second group of bits of said input data word into a second set of output data bits.

3. The zero detector of claim 2 wherein said encoding means comprises:
    an adder circuit for summing the bits in each set of output data bits from said first and second read-only memories.

4. The zero detector of claim 3 comprising:
    means combining the signal outputs from said adder circuit for providing a signal representing whether the number of zero bits is equal to or greater than the number of one bits in said input data word.

5. The zero detector of claim 4 wherein said means for combining said signal outputs comprises:
    a NOR gate for receiving the output of said adder circuit.

6. The zero detector of claim 5 comprising:
    means for determining whether the number of ones in said input data word is an odd number.

7. A zero detector for use with a core memory for conserving the power requirements therein comprising:
    a first read-only memory for converting an input data word of variable length into a first group of bits of said input data word into a first set of output data bits,
    a second read-only memory for converting a second group of bits of said input data word into a second set of output data bits, said first and second output data bits being a lesser number of bits than the bits in said first and second group of input data bits,
    an adder circuit for summing the number of bits in each set of output data bits from said first and second read-only memories, and for determining whether the number of zero bits are equal to or greater than the number of one bits in said input data word, and
    a NOR gate combining the signal outputs from said adder circuit for providing an output signal to said core memory instructing said core memory to convert said output zero bits to ones and ones to zeros whereby the core memory power is conserved.

8. The zero detector of claim 7 comprising:
    means for determining whether the number of ones in said input data word is an odd number.

9. The zero detector of claim 7 comprising:
    first and second zero detectors,
    an adder circuit connected to the output of said first and second zero detectors, and
    a NOR gate combining signal outputs from said first and second zero detectors and said adder circuit for obtaining an output signal representative of the number of zeros in the input data word in said first and second zero detectors.

10. A zero detector for conserving core memory power comprising:
    a first read-only memory for encoding a first group of input data bits into a first set of output data bits having a lesser number of bits than said first group of input data bits,
    a second read-only memory for encoding a second group of input data bits into a second set of output data bits having a lesser number of bits than said second group of input data bits,
    an adder circuit connected to the output of said first and second read-only memories for summing said first and second output data bits and for determining whether the number of zero bits in said first and second groups of input bits are equal to or greater than the number of one bits in said first and second groups of input data bits, and
    a NOR gate connected to the output of said adder circuit for providing an output signal to a core memory instructing said core memory to convert zero bits to one and one bits to zero whereby the core memory power is conserved.

* * * * *